(12) United States Patent  
Lin

(10) Patent No.: US 10,680,365 B1  
(45) Date of Patent: Jun. 9, 2020

(54) PLUG BOARD MODULE WITH CIRCUIT BOARD

(71) Applicant: Jui Hsiang Lin, New Taipei (TW)

(72) Inventor: Jui Hsiang Lin, New Taipei (TW)

( * ) Notice: Subject to any disclaimer, the term of this patent is extended or adjusted under 35 U.S.C. 154(b) by 0 days.

(21) Appl. No.: 16/425,637

(22) Filed: May 29, 2019

(51) Int. Cl.
*H01R 12/73* (2011.01)
*H01R 12/71* (2011.01)
*H01R 13/717* (2006.01)
*H05K 1/02* (2006.01)
*H01R 12/70* (2011.01)

(52) U.S. Cl.
CPC ....... *H01R 12/732* (2013.01); *H01R 12/7088* (2013.01); *H01R 12/716* (2013.01); *H01R 13/717* (2013.01); *H05K 1/0286* (2013.01); *H05K 2201/10325* (2013.01)

(58) Field of Classification Search
CPC  H01R 12/732; H01R 12/7088; H01R 12/716; H01R 12/717; H01R 12/72; H05K 2201/10325
USPC .......................................................... 439/62
See application file for complete search history.

(56) References Cited

U.S. PATENT DOCUMENTS

| | | | | |
|---|---|---|---|---|
| 6,065,679 A | * | 5/2000 | Levie ................... | G06Q 20/343 235/462.47 |
| 9,770,369 B2 | * | 9/2017 | Sarangapani ....... | A61M 1/0088 |
| 10,594,845 B2 | * | 3/2020 | Hebert ................. | G06F 1/1637 |
| 2014/0078708 A1 | * | 3/2014 | Song ................... | H04M 1/0264 361/809 |

* cited by examiner

*Primary Examiner* — Hien D Vu
(74) *Attorney, Agent, or Firm* — Che-Yang Chen; Law Office of Michael Chen

(57) ABSTRACT

A plug board module with a circuit board, comprising at least one plug board, at least one circuit board and at least one cover. The plug board has a first plug-in area and a board trough, and the first plug-in area is formed with a plurality of first jacks and disposed with least one terminal set. The circuit board is disposed in the board trough and has a side conductive portion and a butt component, and conductive terminals disposed outside the first plug-in area are oppositely disposed in the side conductive portion. The cover covers the plug board and the circuit board, and has a plurality of through holes communicating with the first jacks. Thereby, the plug board can be connected to side conductive slots through the conductive terminals to achieve electrical conduction with the circuit board that is provided for an evaluation board to plug in directly.

8 Claims, 6 Drawing Sheets

PLUG BOARD MODULE WITH CIRCUIT BOARD

BACKGROUND OF THE INVENTION

Field of Invention

The present invention relates to a plug board module, and more particularly to a plug board module with a circuit board capable of quickly plugging in an evaluation board, saving the plug-in and improving the stability.

Related Art

The evaluation board used in the electronic engineering on the market is a printed circuit board with a minimum amount of supporting logic circuits, and some of the evaluation boards are also provided with an MCU wafer in addition to having a small amount of supporting logic circuits. Besides the evaluation board can allow the ones starting to learn the supporting logic circuit or MCU wafer to quickly grasp the operating principles and method of usage, the evaluation board can also be used to verify whether the interfaces of the MCU wafer JO and the external expansion circuit can meet the system requirements, or verify the feasibility of the program. It can further make the engineers familiar with the characteristics of a certain MCU wafer, and thus can be programmable controlled. Direct use of the system evaluation board can also accelerate the development of some equipment, especially for equipment with embedded system. Currently, there are various evaluation boards on the market for engineers to use, such as Arduino evaluation board, Raspberry Pi, Intel Edison evaluation board (Galileo), LinkIt (also known as LinkIt One) platform, or the domestic Banana Pi, etc., which are developed based on a certain processor architecture (ARM or x86), and with certain hardware design and I/O peripherals so that the engineer can complete the subsequent development or application, and the engineer will use the evaluation board on the test substrate to construct the pre-connected circuit while using the evaluation board for subsequent development. The so-called test substrate is the solderless universal plug circuit board, it is commonly known as the breadboard, but when the circuit test is performed between the evaluation board and the breadboard, it is necessary to use wires or signal transmission lines between the evaluation board and the breadboard for signal transmission and power supply plug-in, or another circuit is required for signal transmission and power supply plug-in with wires or signal transmission lines. This plug-in method is liable to cause inconvenience in operation and analog circuit, and is easy to be incompletely inserted, resulting in inability to electrically conduct and low stability. Or as shown in FIG. 1, which is an exploded view of a conventional plug board, a plug board 6 mainly has a plug-in cover 61, a circuit board 62 and a base 63, wherein the circuit board 62 is soldered with a plurality of conductive terminals 621, the plug-in cover 61 is assembled on the circuit board 62, and the conductive terminals 621 are inserted into insertion holes 611 of the plug-in cover 61 from a lower side of the plug-in cover 61. The plug-in cover 61 and the circuit board 62 are fixedly disposed by the conductive terminals 621, if the circuit board 62 is damaged or faulty, the circuit board 62 cannot be directly removed from the plug-in cover 61, so it is necessary to replace the entire plug board 6 to incur expenditure of replacement costs.

Therefore, how to improve the above-mentioned drawbacks is the technical difficulty that the inventor of the present invention wants to solve.

SUMMARY OF THE INVENTION

Therefore, in order to effectively solve the above problems, a main object of the present invention is to provide a plug board module with a circuit board capable of quickly plugging in an evaluation board, and reducing or eliminating the use of conducting wires to improve stability.

Another object of the present invention is to provide a plug board module with a circuit board capable of eliminating the plug-in of a power module.

Another object of the present invention is to provide a plug board module with a circuit board capable of reducing replacement costs.

In order to achieve the above objects, the present invention provides a plug board module with a circuit board, the plug board module comprises at least one plug board, at least one circuit board and at least one cover. Wherein the plug board has at least one first plug-in area and at least one board trough, the first plug-in area is adjacent to the board trough, the first plug-in area is formed with a plurality of first jacks, and the first jacks are disposed with at least one terminal set therein. The terminal set has a plurality of conductive terminals, and the conductive terminals of the terminal set are partially disposed in the first jacks respectively, and one of the conductive terminals is oppositely disposed outside the first plug-in area. The circuit board is disposed in the board trough, and the circuit board has a side conductive portion and a butt component. The side conductive portion has a plurality of side conductive slots, and the conductive terminals disposed outside the first plug-in area are oppositely disposed in the side conductive slots. The cover covers the plug board and the circuit board, and the cover has a plurality of through holes communicating with the first jacks. Thereby, the plug board can be connected to the side conductive slots through the conductive terminals to achieve electrical conduction with the circuit board, and the circuit board is provided for an evaluation board to plug in directly, and thus achieving the efficacies of quickly plugging in the evaluation board, and reducing or eliminating the use of conducting wires to improve stability.

According to one embodiment of the plug board module with the circuit board of the present invention, wherein the first plug-in area has a plurality of ribs and an outer rib, and the first jacks are formed between the ribs and the outer rib.

According to one embodiment of the plug board module with the circuit board of the present invention, wherein the terminal set has at least one engage slot, the engage slot is formed between the adjacent conductive terminals, and the engage slot is assembled with the ribs and the outer rib, the conductive terminal of the terminal set is partially disposed in the first jack, and at least one of the conductive terminals of the terminal set is oppositely and protrudingly disposed on an outer side of the outer rib and disposed in the side conductive slot.

According to one embodiment of the plug board module with the circuit board of the present invention, wherein the plug board further has at least one second plug-in area, the second plug-in area is formed with a plurality of second jacks, and the through holes of the cover communicate with the second jacks.

According to one embodiment of the plug board module with the circuit board of the present invention, wherein at least one assemble portion is formed in the board trough, and the circuit board has at least one assemble hole for assembling with the assemble portion.

According to one embodiment of the plug board module with the circuit board of the present invention, wherein the circuit board is formed with a plurality of light-emitting members electrically connected to the side conductive slots, the light-emitting member is provided with at least one light cover, and the cover has a plurality of light holes for disposing the light cover.

According to one embodiment of the plug board module with the circuit board of the present invention, wherein a power supply area, a digital circuit area, an analog circuit area and a signal transmission area are further formed on the plug board.

According to one embodiment of the plug board module with the circuit board of the present invention, wherein an opening is formed on one side of the cover opposite to the board trough, and the butt component is oppositely disposed in the opening.

According to one embodiment of the plug board module with the circuit board of the present invention, wherein the plug board is further formed with a battery slot, and the battery slot is disposed with at least one power supply member therein.

DETAILED DESCRIPTION OF THE INVENTION

The above objects of the present invention, as well as its structural and functional features, will be described in accordance with the preferred embodiments of the drawings.

Figure 1:
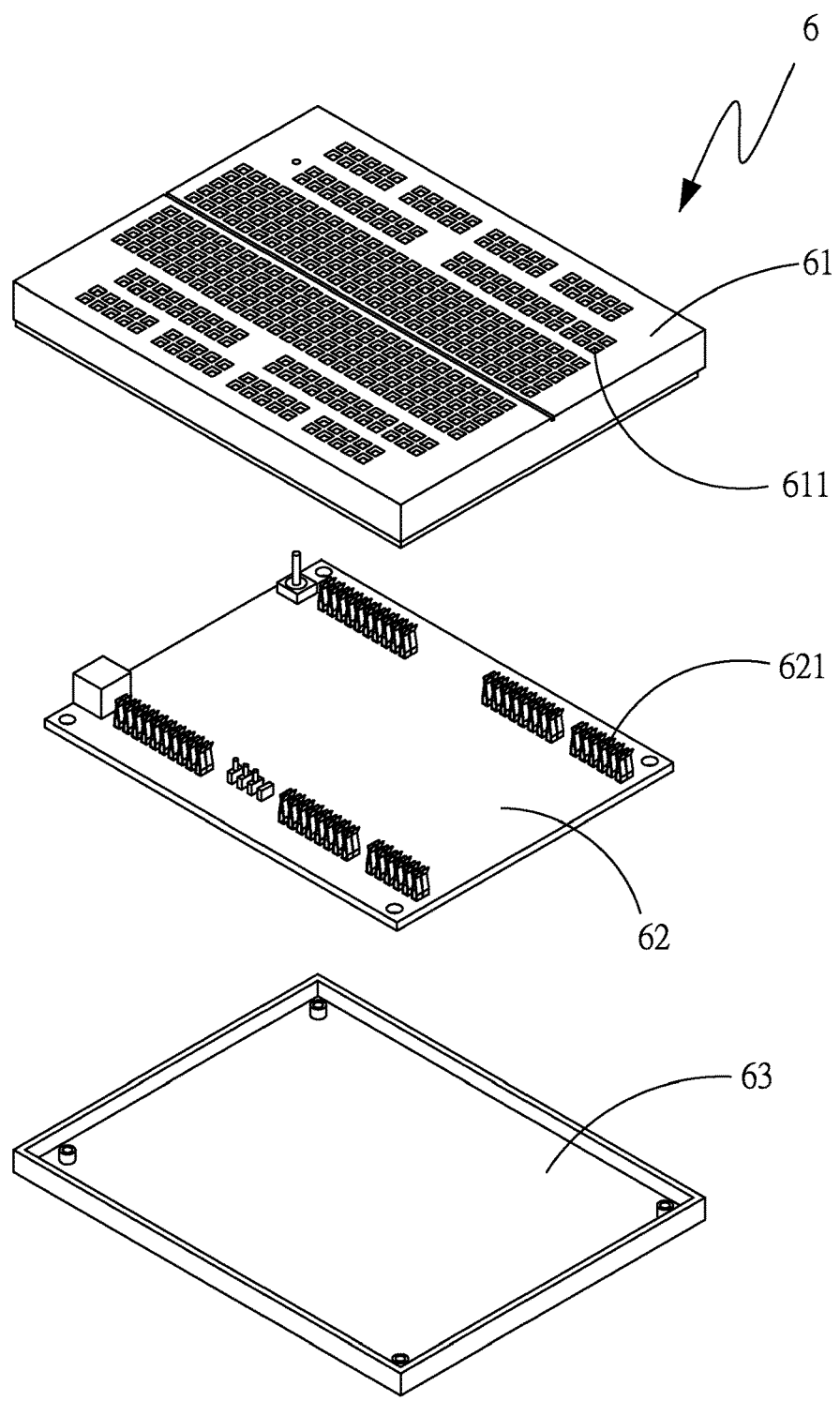
FIG. 1 is an exploded view of a conventional plug board.
Figure 2:
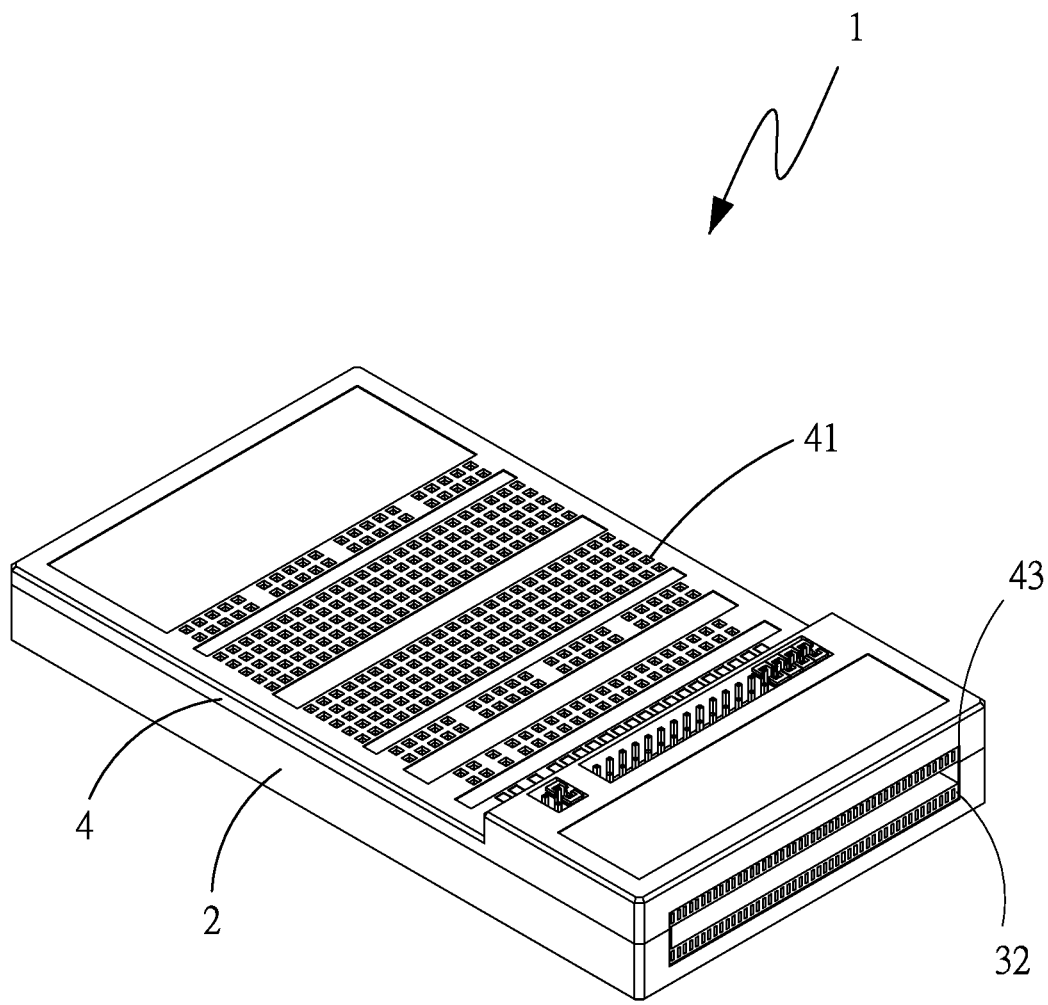
FIG. 2 is a perspective assembly view of a preferred embodiment of the present invention.
Figure 3:
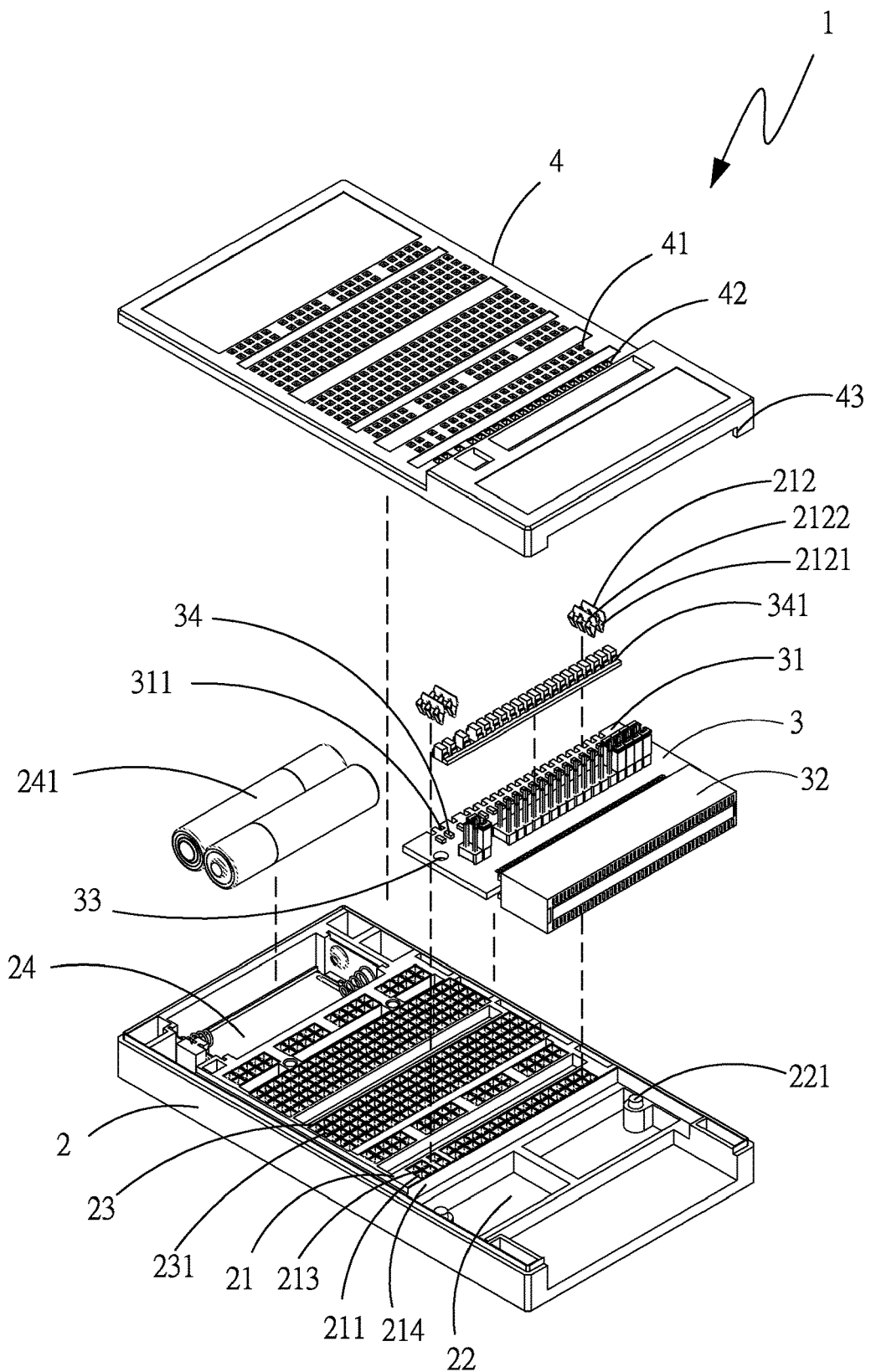
FIG. 3 is a perspective exploded view of a preferred embodiment of the present invention.
Figure 4:
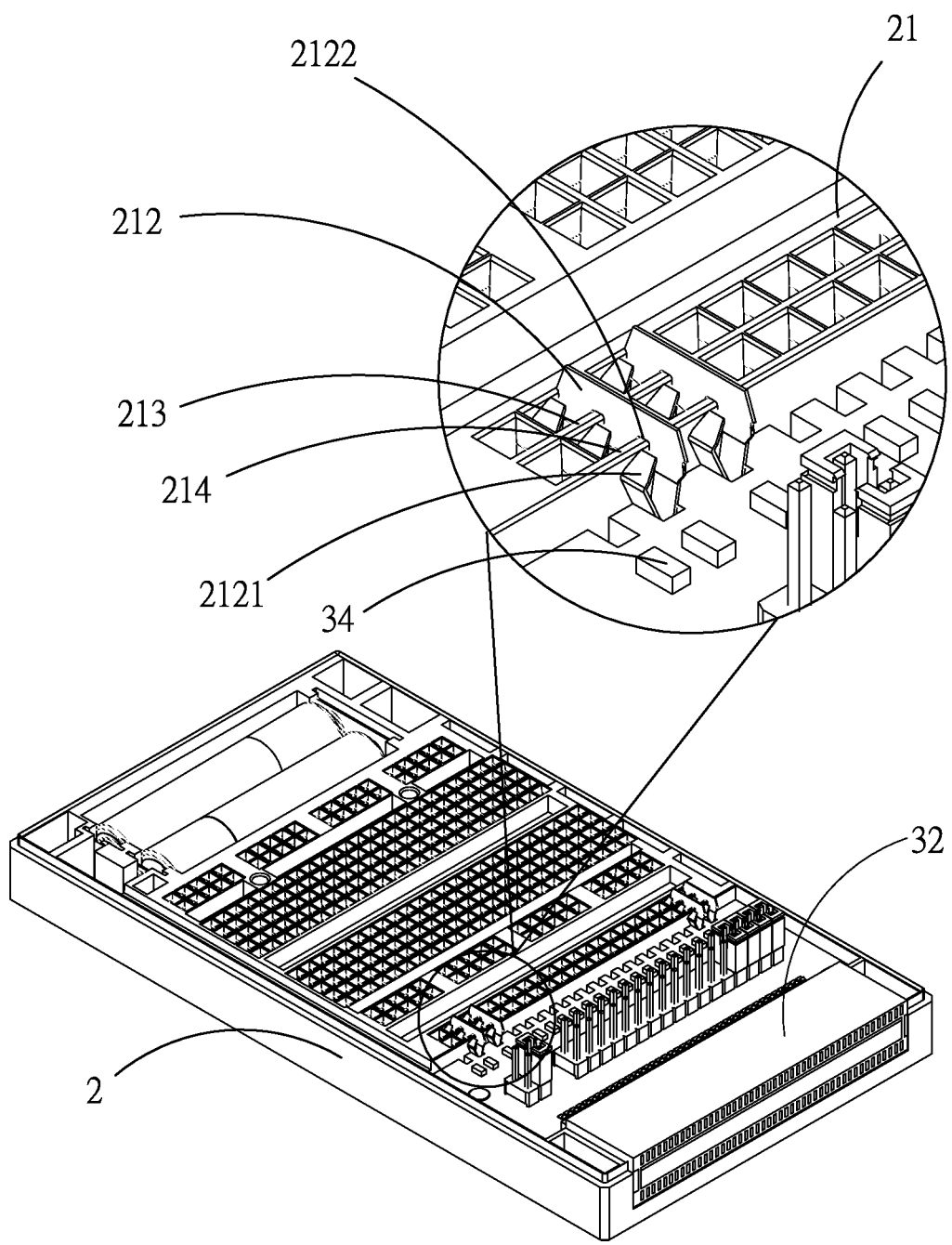
FIG. 4 is a partial perspective assembly view of a preferred embodiment of the present invention.

Please refer to FIG. 2, FIG. 3 and FIG. 4, which are perspective assembly view, perspective exploded view and partial perspective assembly view of a preferred embodiment of the present invention. It can be clearly seen from the figures that, a plug board module 1 comprises at least one plug board 2, at least one circuit board 3 and at least one cover 4.

The plug board 2 is formed with at least one first plug-in area 21, at least one board trough 22, at least one second plug-in area 23 and at least one battery slot 24, wherein the first plug-in area 21 is formed with a plurality of first jacks 211 and disposed with at least one terminal set 212. The terminal set 212 has a plurality of series-connected conductive terminals 2121. The conductive terminals 2121 are formed as V-shaped metal elastic plates, and the terminal set 212 is formed with an engage slot 2122 between every two of the conductive terminals 2121. The first plug-in area 21 has a plurality of ribs 213 and an outer rib 214. The first jacks 211 are formed between the ribs 213 and the outer rib 214, and the engage slots 2122 are assembled with the ribs 213 and the outer rib 214. The conductive terminals 2121 of the terminal set 212 are partially disposed in the first jacks 211 respectively, and at least one of the conductive terminals 2121 of the terminal set 212 is oppositely and protrudingly disposed on an outer side of the outer rib 214. At least one assemble portion 221 is formed in the board trough 22. The second plug-in area 23 is formed with a plurality of second jacks 231, and inside the second jack 231 is disposed with conductive members (not shown in the figures) electrically connected to each other. The battery slot 24 is disposed with at least one power supply member 241 electrically connected to the terminal set 212 in the first jacks 211 and the conductive members in the second jacks 231.

Wherein the circuit board 3 is disposed in the board trough 22, at least one side conductive portion 31 is formed at a position of a side of the circuit board 3, and the circuit board 3 is disposed with a butt component 32, at least one assemble hole 33 and a plurality of light-emitting members 34. Wherein the side conductive portion 31 has a plurality of side conductive slots 311, and the conductive terminal 2121 disposed outside the first plug-in area 21 is oppositely disposed in the side conductive slot 311. The assemble hole 33 and the assemble portion 221 assemble with each other. The light-emitting members 34 are electrically connected to the corresponding side conductive slots 311, respectively, the light-emitting members 34 are disposed with at least one light cover 341 thereon, and the light cover 341 is hooded on the light-emitting members 34.

Wherein the cover 4 covers the plug board 2 and the circuit board 3, the cover 4 has a plurality of through holes 41 communicating with the first jacks 211 and the second jacks 231. The cover 4 has a plurality of light holes 42 and at least one opening 43, the light holes 42 are provided for disposing the light covers 341, and the butt component 32 is oppositely disposed in the opening 43.

Figure 5:
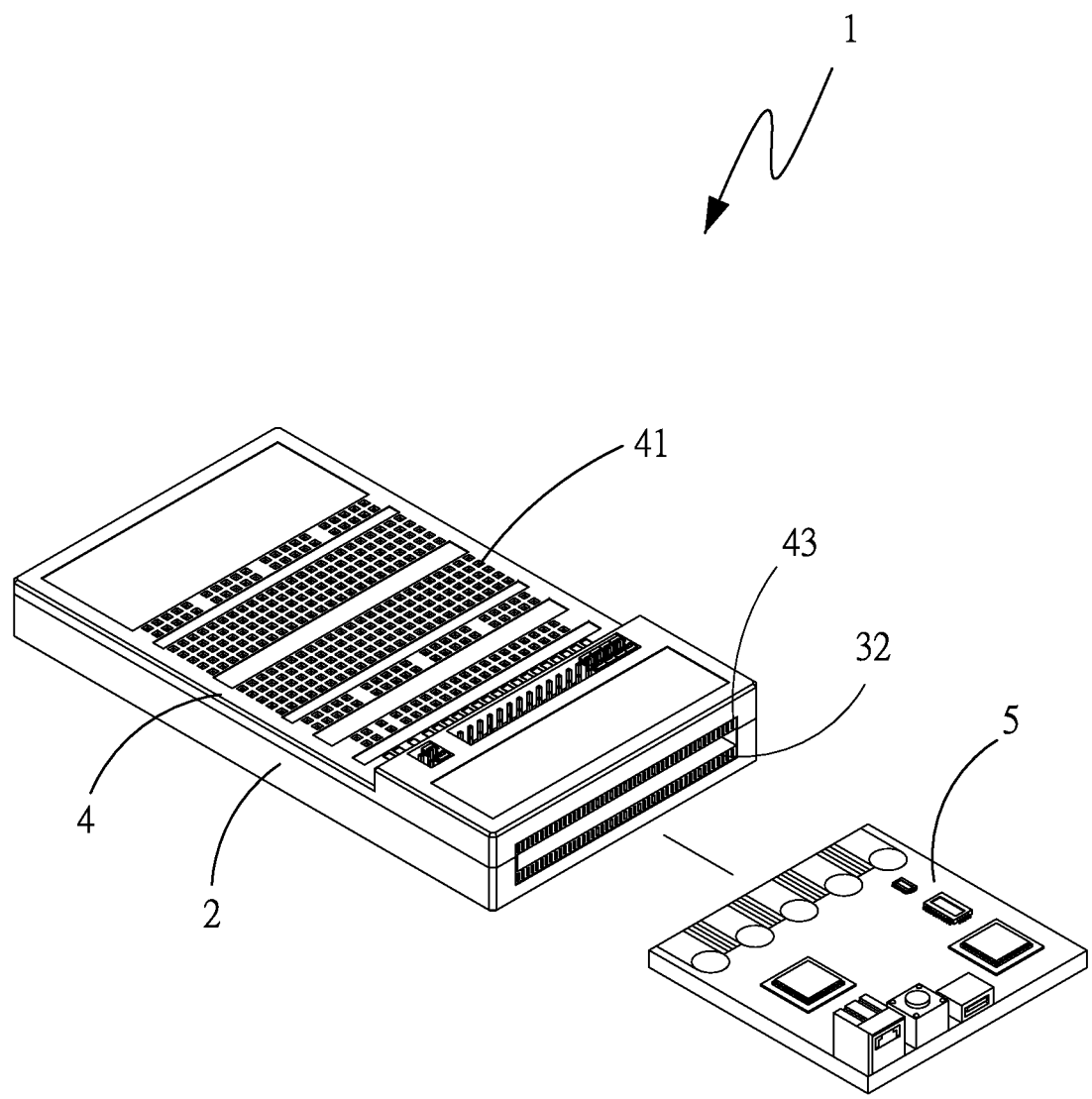
FIG. 5 is a schematic diagram of the implementation of a preferred embodiment of the present invention.

Please refer to the foregoing drawings and FIG. 5, which is schematic diagram of the implementation of a preferred embodiment of the present invention. It can be clearly seen from the figure that when the plug board module 1 is used, an evaluation board 5 can be directly assembled to the butt component 32, and electronic components or conducting wires can be directly inserted into the through holes 41 of the cover 4 to be electrically connected to the terminal sets 212 and the conductive members of the first jacks 211 and the second jacks 231. The conductive terminals 2121 of the terminal set 212 are electrically connected to the side conductive slots 311 311 and the side conductive portion 31 of the circuit board 3, so that the plug board 2 can be directly electrically connected to the circuit board 3, the circuit board 3 can be directly connected to the evaluation board 5, and the power supply member 241 in the battery slot 24 can directly supply electric power to the terminal set 212 in the first jacks 211 and the conductive members in the second jacks 231. Thereby the plug board 2 can be connected to the side conductive slots 311 through the conductive terminals 2121 to achieve electrical connection with the circuit board 3, and with the conductive terminal 2121 being the V-shaped metal elastic plate, when the conductive terminals 2121 are disposed in the side conductive slots 311, inner walls of the side conductive slot 311 are pressed against the conductive terminal 2121 to achieve the effect of tight pressing, and the circuit board 3 can be provided for directly plugging in the evaluation board 5, thereby eliminating the need for wires or signal transmission lines between the plug board 2 and the circuit board 3 for signal transmission and power supply plug-in, achieving the efficacies of quickly plugging in the evaluation board 5, and reducing or eliminating the use of conducting wires to improve stability. When each of the terminal sets 212 is electrically connected with the electronic components or the conducting wires and the power is supplied by the power supply member 241, the light-emitting member 34 corresponding to the terminal set 212 generates a light source that is transmitted through the light cover 341, so that a user can clearly know whether the plug-in connection is energized or not, so as to achieve the efficacy of conveniently using the plug board module 1 for circuit test. If the circuit board 3 is damaged or faulty, the circuit board 3 only needs to be directly separated from the terminal sets 212 and removed from the board trough 22, thereby achieving the efficacies of directly replacing the circuit board 3 and saving replacement costs.

Figure 6:
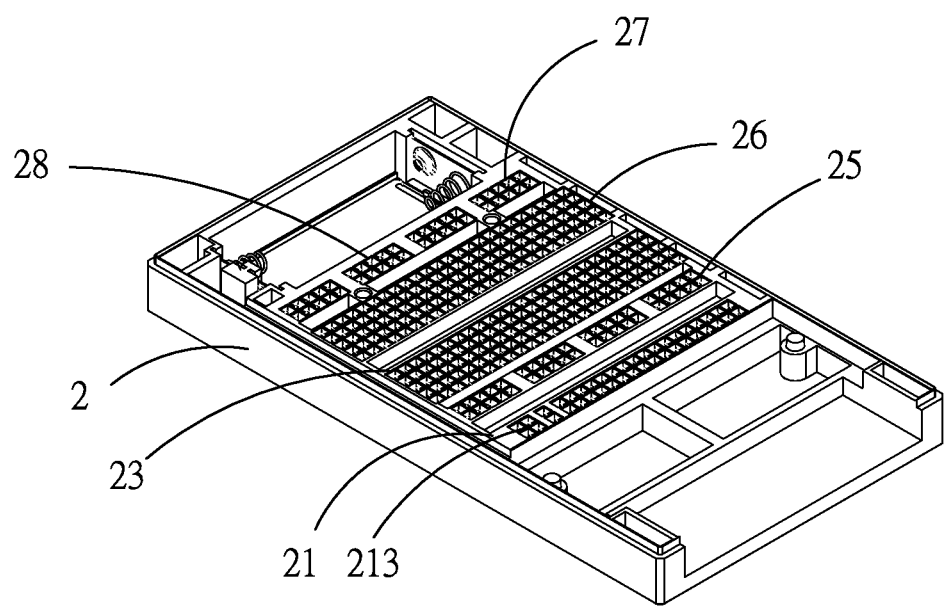
FIG. 6 is a schematic diagram of the implementation of a plug board of the present invention.

Please refer to the foregoing drawings and FIG. 6, which is a schematic diagram of the implementation of a plug board of the present invention. It can be clearly seen from the figure that in the second plug-in area 23 the plug board 2 can be further defined with a power supply area 25, a digital circuit area 26, an analog circuit area 27 and a signal transmission area 28, wherein the power supply area 25, the digital circuit area 26, the analog circuit area 27 and the signal transmission area 28 are simultaneously defined and circuit-set when the plug board module 1 is produced, so that when the plug board 2 is used in the plug board module 1, through the first plug-in area 21, the second plug-in area 23, the power supply area 25, the digital circuit area 26, the analog circuit area 27 and the signal transmission area 28, the electronic components can be inserted in an intuitive manner, thereby improving the convenience of the use of the plug board module 1 and achieving the efficacy of quick plug-in.

It is to be understood that the above description is only preferred embodiments of the present invention and is not used to limit the present invention, and changes in accordance with the concepts of the present invention may be made without departing from the spirit of the present invention, for example, the equivalent effects produced by various transformations, variations, modifications and applications made to the configurations or arrangements shall still fall within the scope covered by the appended claims of the present invention.

What is claimed is:

1. A plug board module with a circuit board, comprising:
   at least one plug board, the plug board being formed with at least one first plug-in area and at least one board trough thereon, the first plug-in area being formed with a plurality of first jacks and disposed with at least one terminal set, and the terminal set having a plurality of conductive terminals;
   at least one circuit board, the circuit board being disposed in the board trough, the circuit board having a side conductive portion and a butt component, and the side conductive portion having a plurality of side conductive slots electrically assembled to the conductive terminals; and
   at least one cover, the cover covering the plug board and the circuit board, and the cover having a plurality of through holes communicating with the first jacks;
   wherein the first plug-in area has a plurality of ribs and an outer rib, and the first jacks are formed between the ribs and the outer rib; and
   wherein the plug board further has at least one second plug-in area, the second plug-in area is formed with a plurality of second jacks, and the through holes of the cover communicate with the second jacks.

2. The plug board module with the circuit board as claimed in claim 1, wherein the terminal set has at least one engage slot, the engage slot is formed between the adjacent conductive terminals, and the engage slot is assembled with the ribs and the outer rib, the conductive terminal of the terminal set is partially disposed in the first jack, and at least one of the conductive terminals of the terminal set is oppositely and protrudingly disposed on an outer side of the outer rib and disposed in the side conductive slot.

3. The plug board module with the circuit board as claimed in claim 1, wherein at least one assemble portion is formed in the board trough, and the circuit board has at least one assemble hole for assembling with the assemble portion.

4. The plug board module with the circuit board as claimed in claim 1, wherein the circuit board is formed with a plurality of light-emitting members electrically connected to the side conductive slots, the light-emitting member is provided with at least one light cover, and the cover has a plurality of light holes for disposing the light cover.

5. The plug board module with the circuit board as claimed in claim 4, wherein a power supply area, a digital circuit area, an analog circuit area and a signal transmission area are further formed on the plug board.

6. The plug board module with the circuit board as claimed in claim 1, wherein an opening is formed on one side of the cover opposite to the board trough, and the butt component is oppositely disposed in the opening.

7. The plug board module with the circuit board as claimed in claim 1, wherein the plug board is further formed with a battery slot, and the battery slot is disposed with at least one power supply member therein.

8. The plug board module with the circuit board as claimed in claim 1, wherein the conductive terminal is a V-shaped metal elastic plate.

* * * * *